(12) United States Patent
Van Heumen et al.

(10) Patent No.: US 10,948,421 B2
(45) Date of Patent: Mar. 16, 2021

(54) LASER-DRIVEN PHOTON SOURCE AND INSPECTION APPARATUS INCLUDING SUCH A LASER-DRIVEN PHOTON SOURCE

(71) Applicant: ASML Netherlands B.V., Veldhoven (NL)

(72) Inventors: Martijn Petrus Christianus Van Heumen, Veldhoven (NL); Sergii Denega, Veldhoven (NL); Ralph Jozef Johannes Gerardus Anna Maria Smeets, Veldhoven (NL); Remco Marcel Van Dijk, Veldhoven (NL); Marc Van Kemenade, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 5 days.

(21) Appl. No.: 15/506,850

(22) PCT Filed: Aug. 27, 2015

(86) PCT No.: PCT/EP2015/069700
§ 371 (c)(1),
(2) Date: Feb. 27, 2017

(87) PCT Pub. No.: WO2016/030485
PCT Pub. Date: Mar. 3, 2016

(65) Prior Publication Data
US 2017/0241914 A1  Aug. 24, 2017

(30) Foreign Application Priority Data
Aug. 28, 2014  (EP) .................................... 14182657

(51) Int. Cl.
*H01J 65/04* (2006.01)
*H01J 65/06* (2006.01)
(Continued)

(52) U.S. Cl.
CPC ..... *G01N 21/8806* (2013.01); *G01N 21/9501* (2013.01); *G01N 21/956* (2013.01);
(Continued)

(58) Field of Classification Search
CPC . G01N 21/8806; G01N 21/9501; H01J 65/04; H01J 65/06
See application file for complete search history.

(56) References Cited

U.S. PATENT DOCUMENTS 3,609,012 A * 9/1971 Street .................. G02B 1/00
359/715
3,995,136 A * 11/1976 Steiger .................. G21B 1/23
219/121.85
(Continued)

FOREIGN PATENT DOCUMENTS

TW  201304050 A  1/2013
TW  201423032 A  6/2014

OTHER PUBLICATIONS

International Search Report directed to related International Patent Application No. PCT/EP2015/069700, dated Nov. 27, 2015; 5 pages.
(Continued)

*Primary Examiner* — Shawn Decenzo
(74) *Attorney, Agent, or Firm* — Sterne, Kessler, Goldstein & Fox P.L.L.C.

(57) ABSTRACT

Disclosed is a laser-driven photon source comprising drive optics which focus drive radiation so as to maintain a plasma. The point spread function of the drive optics has a point spread function (75) which is configured such that a spectral position of a peak output wavelength of a black body portion of output radiation emitted by said plasma within a desired wavelength band.

14 Claims, 4 Drawing Sheets

(51) Int. Cl.
*G01N 21/88* (2006.01)
*G01N 21/956* (2006.01)
*G03F 7/20* (2006.01)
*G01N 21/95* (2006.01)

(52) U.S. Cl.
CPC ...... *G03F 7/70033* (2013.01); *G03F 7/70575* (2013.01); *G03F 7/70616* (2013.01); *H01J 65/04* (2013.01); *G01N 2021/95676* (2013.01)

(56) References Cited

U.S. PATENT DOCUMENTS

| | | | | |
|---|---|---|---|---|
| 4,876,602 | A * | 10/1989 | Zwirn | G06T 5/20 348/625 |
| 7,514,305 | B1 * | 4/2009 | Hawryluk | H01L 21/67115 438/166 |
| 7,705,331 | B1 * | 4/2010 | Kirk | G03F 7/70575 250/493.1 |
| 8,525,138 | B2 * | 9/2013 | Smith | B82Y 10/00 250/503.1 |
| 8,822,875 | B2 * | 9/2014 | Webster | B23K 15/08 219/121.11 |
| 8,921,814 | B2 * | 12/2014 | Pellemans | H05B 41/38 250/504 R |
| 9,185,786 | B2 * | 11/2015 | Smith | B82Y 10/00 |
| 9,357,626 | B2 * | 5/2016 | Pellemans | H05B 41/38 |
| 9,941,655 | B2 * | 4/2018 | Chimmalgi | H01S 3/0915 |
| 2005/0052643 | A1 * | 3/2005 | Lange | G01N 21/8806 356/237.1 |
| 2006/0033921 | A1 | 2/2006 | Den Boef et al. | |
| 2006/0066855 | A1 | 3/2006 | Boef et al. | |
| 2007/0268374 | A1 * | 11/2007 | Robinson | H04N 5/349 348/222.1 |
| 2010/0201963 | A1 | 8/2010 | Cramer et al. | |
| 2010/0328655 | A1 | 12/2010 | Den Boef | |
| 2011/0069292 | A1 | 3/2011 | Den Boef | |
| 2011/0147616 | A1 * | 6/2011 | Beaurepaire | G01N 21/636 250/459.1 |
| 2011/0204265 | A1 * | 8/2011 | Smith | B82Y 10/00 250/503.1 |
| 2012/0205546 | A1 * | 8/2012 | Solarz | G01N 21/718 250/372 |
| 2012/0307233 | A1 | 12/2012 | Boguslavskiy et al. | |
| 2013/0003384 | A1 * | 1/2013 | Bezel | G01J 3/021 362/276 |
| 2013/0242533 | A1 * | 9/2013 | Li | F21V 9/38 362/84 |
| 2013/0329204 | A1 * | 12/2013 | Pellemans | G03F 7/70483 355/67 |
| 2014/0118740 | A1 | 5/2014 | Fontaine et al. | |
| 2016/0255710 | A1 | 9/2016 | Van Heumen | |

OTHER PUBLICATIONS

International Preliminary Report on Patentability and Written Opinion of the International Searching Authority directed to related International Patent Application No. PCT/EP2015/069700, dated Feb. 28, 2017; 6 pages.

Harilal et al. "Influence of spot size on extreme ultraviolet efficiency of laser-produced Sn plasmas," Applied Physics Letters, vol. 95, No. 22, Nov. 30, 2009; 3 pages.

Kumar et al., "Dynamics of plasma expansion in the pulsed laser material interaction," Sadhana, Journal of the Indian Academy of Sciences, vol. 35, Part 4, Aug. 2010; pp. 493-511.

Arkhipkin et al., "Light-induced gas kinetics in the field of quasi-black-body radiation," Lasers and Optoelectronics, SPIE, vol. 1979, 1992; pp. 689-699.

* cited by examiner

US 10,948,421 B2

LASER-DRIVEN PHOTON SOURCE AND INSPECTION APPARATUS INCLUDING SUCH A LASER-DRIVEN PHOTON SOURCE

CROSS-REFERENCE TO RELATED APPLICATIONS

This application claims priority of EP application 14182657.8 which was filed on Aug. 28, 2014 and which is incorporated herein in its entirety by reference.

BACKGROUND

Field of the Invention

The invention relates to a laser-driven photon source. The present invention further relates to an inspection apparatus usable, for example, to perform metrology in the manufacture of devices by lithographic techniques and comprising such a laser-driven photon source.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in patent applications US20100328655A1 and US2011069292A1 which documents are hereby incorporated by reference in their entirety.

Inspection apparatuses may use plasma-based photon sources, for example laser-driven photon sources (LDPS), otherwise known as laser-driven light sources, as these offer high brightness. Plasmas are generated in a gaseous medium by the application of energy through electric discharge, and laser energy. The spectral distribution of the radiation may be broadband or narrowband in nature, and wavelengths may be in the near infrared, visible and/or ultraviolet (UV) bands. Published patent application US 2011204265A1 discloses plasma-based light sources including laser-driven photon sources.

The amount of output radiation provided by an LDPS apparatus is dependent upon inter alia the output power of the laser energy. The higher the laser energy, the higher the plasma temperature which, in turn, results in more output radiation.

In applications using LDPS sources, the source in use may emit radiation of different wavelengths, including ultraviolet radiation. However, for a number of applications such as inspection applications described herein, it may be that only wavelengths within a desired wavelength band are useful. The desired wavelength band may comprise wavelengths longer than UV radiation wavelengths. In many such applications, the UV radiation wavelengths will be blocked and therefore the generation of radiation at these wavelengths is inefficient and wasteful. In addition, the UV radiation can have an adverse effect on the operation of the LDPS, resulting in solarization of LDPS components.

SUMMARY OF THE INVENTION

The present invention aims to provide a laser-driven photon source with increased radiation output within a preferred wavelength band.

The invention in a first aspect provides a laser-driven photon source comprising drive optics operable to focus drive radiation so as to maintain a plasma; wherein said drive optics has a point spread function which is configured such that a spectral position of a peak output wavelength of a black body portion of output radiation emitted by said plasma is within a desired wavelength band.

The invention in a second aspect comprises an inspection apparatus comprising a laser-driven photon source of the first aspect of the invention described above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
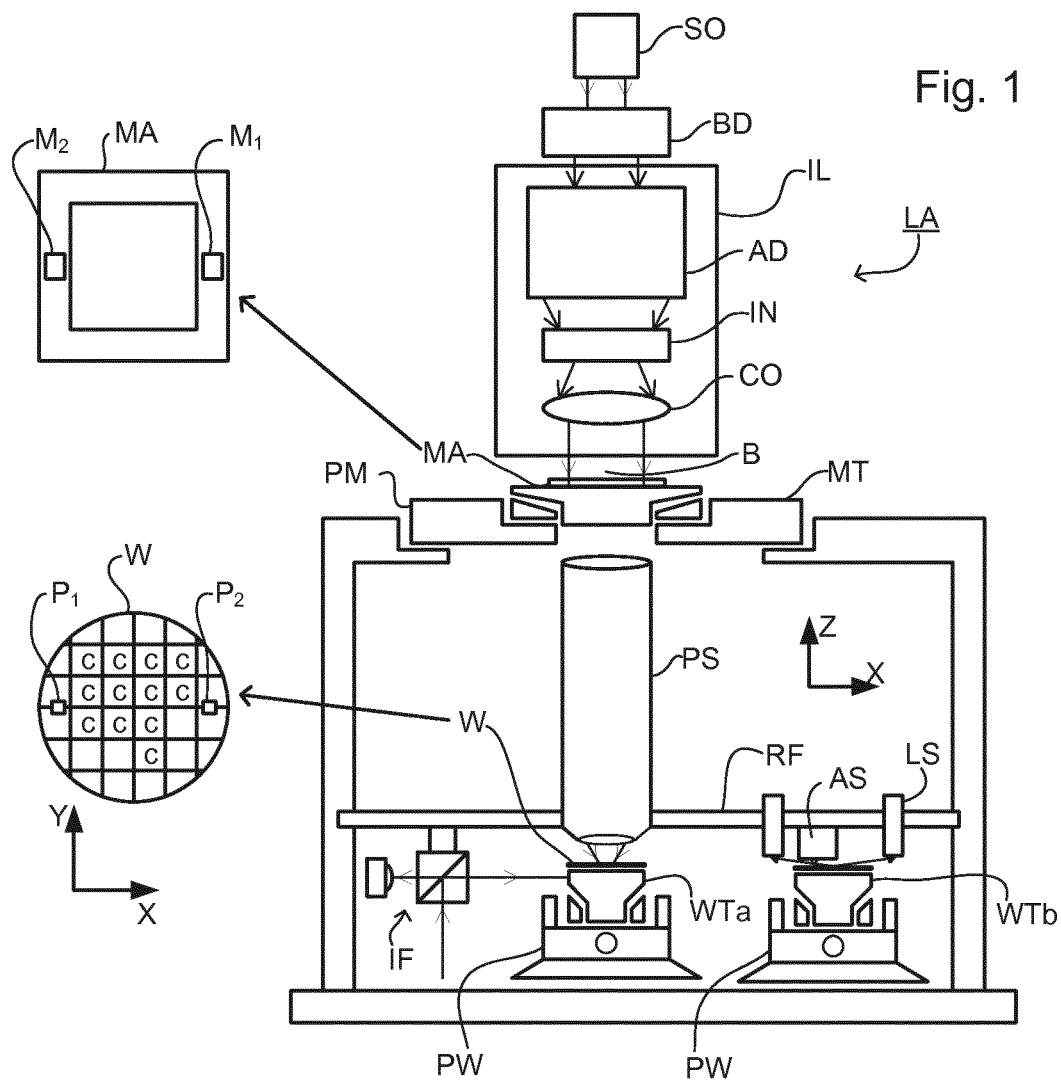
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system may comprise an alignment sensor AS for measuring the position of alignment markers on the substrate. Other preparatory steps may include mapping the surface height contours of the substrate using a level sensor LS.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Figure 2:
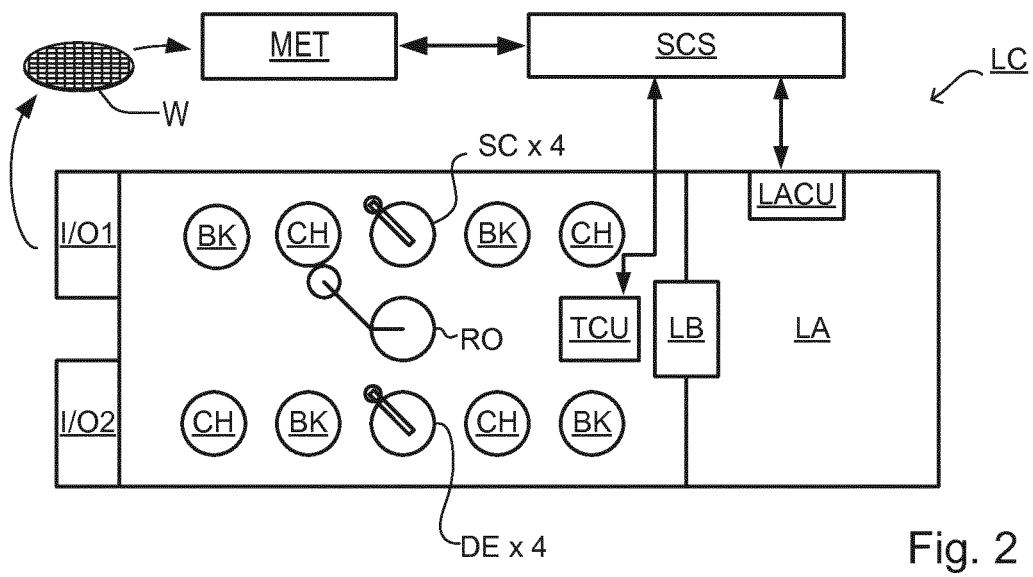
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
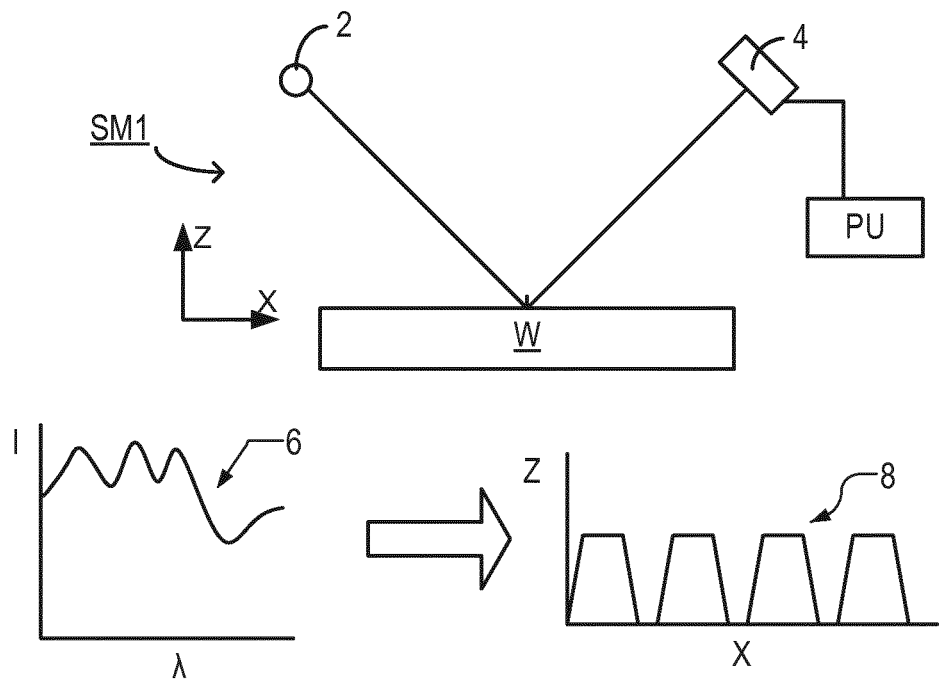
FIG. 3 illustrates the principles of operation of a spectroscopic scatterometer as a first example of an inspection apparatus.

FIG. 3 depicts a known spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
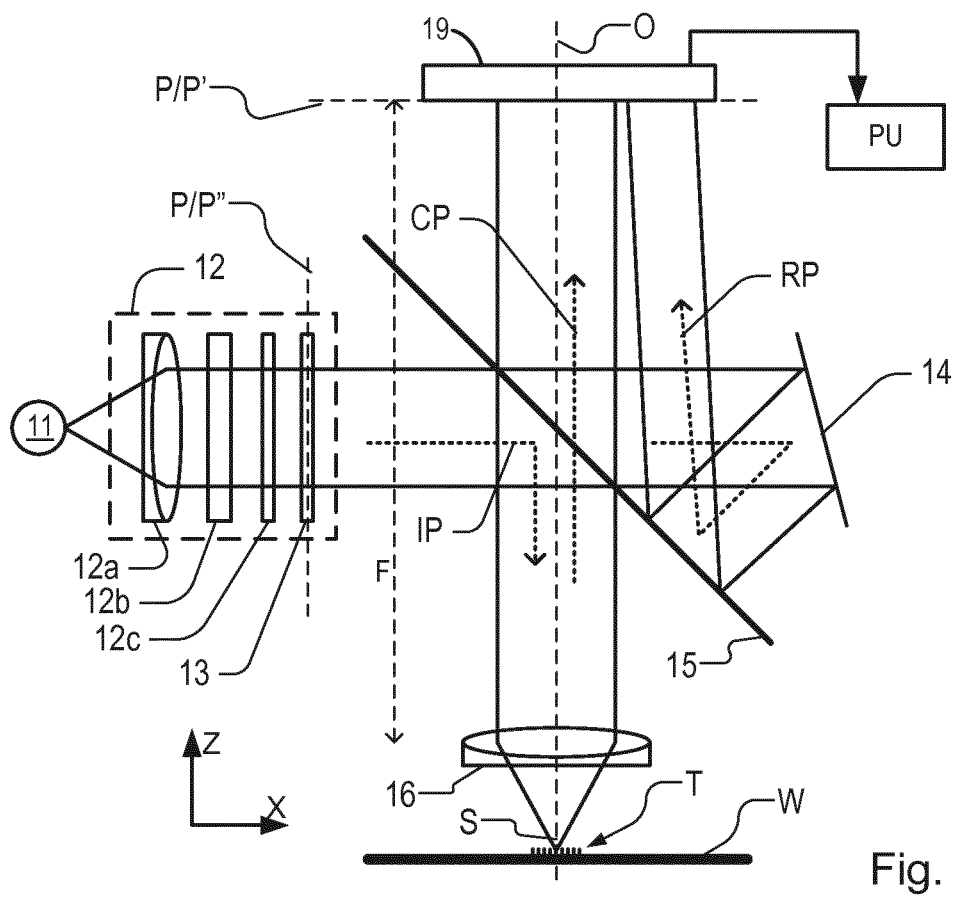
FIG. 4 illustrates in schematic form an angle-resolved scatterometer as another example of an inspection apparatus.

FIG. 4 shows the basic elements of a known angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system is being brought to different locations on the substrate, when in practice the optical system remains substantially stationary and only the substrate moves. Provided the relative position of the substrate and the optical system is correct, it does not matter in principle whether one or both of those is moving in the real world.

When the radiation beam is incident on the beam splitter 16 part of it is transmitted through the beam splitter and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector is preferably a two-dimensional detector so that a two-dimensional angular scatter spectrum or diffraction spectrum of a substrate target 30 can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select preferred bands of wavelengths in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P‴ conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement using the instrument of FIG. 3 or 4 are described for example in published patent application US2006066855A1 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 4, where detector 19 may be an image sensor, such asymmetry in the diffraction orders appears directly as asymmetry in the pupil image recorded by detector 19. This asymmetry can be measured by digital image processing in unit PU, and calibrated against known values of overlay.

Figure 5:
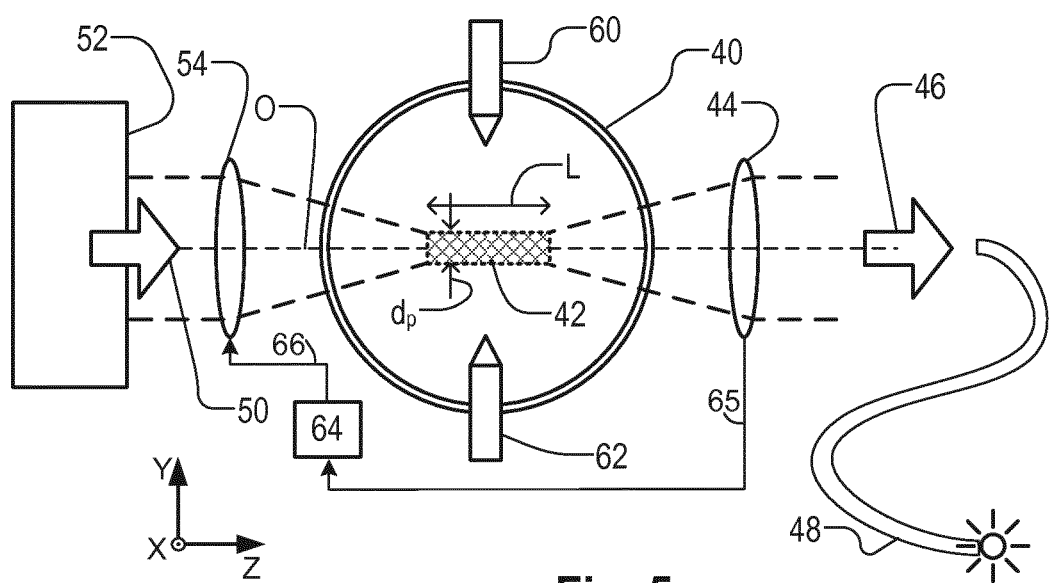
FIG. 5 shows a laser-driven photon source according to an embodiment of the invention.

FIG. 5 shows schematically the principal components of a laser-driven photon source (LDPS) apparatus. Such a laser-driven photon source apparatus may be used as the radiation source 11 in the apparatus of FIG. 4. The central component is a container 40, for example a glass capsule, containing a predetermined gaseous atmosphere. A suitable gas for the gaseous atmosphere may be (for example) xenon (Xe), or a xenon-argon mix. Within this gaseous atmosphere, a plasma 42 is generated in a manner to be described, and the plasma 42 emits radiation. Collection optics 44 forms the emitted radiation into a radiation beam 46 that is coupled to an optical fiber 48. Optical fiber 48 delivers the radiation beam 46 to the point where it is needed. Collection optics 44 is shown here as a simple lens, but can of course be more complex in a practical embodiment. Reflective rather than refractive collection optics may be used.

Plasma 42 is generated by application of drive radiation 50 which is generated in this example by a laser source 52. Drive optics 54 focus the drive radiation 50. Conventionally, the drive radiation is focused such that its narrowest point is at the location where the plasma 42 is desired to be formed and maintained.

The laser source 52 may be one of a number of different types of high power laser available today or in future. It may for example be a Nd:YAG laser, a $CO_2$ laser, a diode laser, a fiber laser. Drive optics 54 is shown here as a simple lens, but can of course be more complex in practical embodiment. Reflective rather than refractive drive optics may be used. Further components may be provided to condition the laser radiation in its profile or spectral characteristics. A beam expander may be used, for example.

Drive radiation 50, although very narrowly focused, is not necessarily sufficient to ignite the plasma 42 from a cold start, and electrodes 60 and 62 are provided with appropriate power and control circuitry (not shown), in order to ignite the plasma 42. These electrodes 60, 62 may be similar to those used in a conventional gas discharge lamp, but are used only during a start-up phase of operation.

In the diagram, axes X, Y and Z are defined for the sake of this description. The Z axis is aligned with an optical axis O. The Y direction is aligned with the electrodes 60, 62. The X axis is transverse to the electrodes, and normal to the plane of the diagram. The apparatus can be constructed or mounted with these axes in any orientation that is convenient for its application. Note that there is no component obstructing the optical path from the plasma 42 to the collection optics 44 in the Z direction. There is also in this example nothing obstructing the radiation path in the X direction (not shown in this view).

It will be noted that plasma 42, or at least the region of the plasma from which the desired radiation is taken, may be elongate in form, having approximately the shape of a cylinder, or cigar. We will refer to the shape as cylindrical for the sake of explanation. The length of the cylinder is L and its diameter is $d_p$. The real plasma will comprise a cloud of elongate form, centered on this cylindrical region. Collection optics 44 is arranged with its optical axis O aligned with the longitudinal direction of the plasma, that is the Z direction in this example. The area of the plasma 42 thus appears as $\pi d_p^2/4$, that is the area of one end of the cylinder. When L is made substantially greater than $d_p$, the depth of plasma from which photons can enter the collection optics through this small area is greater, compared with looking at the plasma 42 in a transverse direction. This allows a higher brightness to be seen over that area, for a given size and intensity of plasma 42. The etendue of an optical source (or receiver) is broadly speaking the product of the area of the source (receiver) and its exit (entrance) angle. The etendue of the collection optics 44, as with any imaging system, is the product of spot size and the square of its numerical aperture (NA). The NA in turn is determined by the entrance angle of the optical system. The etendue of the radiating plasma is in general going to be larger than the etendue of the collection optics 44. Collection optics 44 may be focused at a hypothetical source point midway along the cylinder. In practical examples, the length L of plasma 42 may be on the order of a millimeter, say 0.5 to 5 mm. The diameter $d_p$ may be smaller.

In practice, the plasma absorbs very little of the generated radiation, so that photons emitted anywhere along the length L of the cylinder can travel in the entrance cone of collection optics 44 and into optical fiber 48. Therefore, compared with the transverse direction, the plasma appears brighter (greater luminous flux per unit area per unit solid angle) than when viewed in the transverse direction. Whereas some laser-driven photon sources, such as described in US 2011204265 A1, seek to capture light emitted in the transverse direction, the LDPS illustrated herein captures light emitted in the longitudinal direction to exploit the enhanced brightness and smaller extent of the plasma. Either capturing arrangement can be used in combination with the novel concepts disclosed herein.

The drive radiation 50 emitted by laser source 52 may comprise, for example, infrared wavelengths between 700 nm to 2000 nm. The plasma 42 will typically generate radiation at shorter wavelengths in the infrared, visible and/or ultraviolet bands, for example down to 200 nm or below. Amongst this plasma radiation are the desired wavelengths (for example, between 400 nm and 900 nm) which are usable by metrology apparatuses or in other application. Filter components may be provided in the optical path, for example to reduce the amount of infrared radiation entering collection optics 44 and/or optical fiber 48. Such filter components can be placed inside and/or outside container 40. They may also be integrated with the container wall, and/or with other components of the collection optics 44.

The output spectrum of the radiation emitted by plasma 42 can represented by that of a black body radiator having superimposed thereon the emission lines of the plasma 42 (e.g., xenon) within container 40. It is dependent upon the plasma temperature as to which wavelengths of the output spectrum attributable to black body radiation are predominant. This is as a result of Wien's displacement law: there is an inverse relationship between the peak output wavelength of the black body radiation ($\lambda_{max}$) and its temperature when expressed as a function of wavelength. As a consequence of this, as the temperature of the plasma increases, the peak output wavelength of the black body radiation ($\lambda_{max}$) shifts further into the ultraviolet wavelengths.

As stated, the desired output wavelengths (e.g. those usable by an inspection apparatus such as depicted in FIG. 4) lie in a band, which may be between 400 nm and 900 nm. Where the estimated plasma temperature is about 10000 K, the peak output wavelength of the black body radiation $\lambda_{max}$ is approximately 290 nm. This means that the bulk of the output of the black body radiation is already outside of the desired wavelength band. To provide example values: at a plasma temperature of 6000K 47% of the black body radiation is in a band of between 400 and 800 nm; at 10000 K, 38% of the black body radiation is within this band; and at 15000 K, only 21% of the black body radiation is within this band.

As much of the generated radiation may not be usable, the efficiency of the LDPS, when defined in terms of usable output radiation, is diminished. It may be that there is insufficient output radiation in the desired wavelength band for the application requirements. The conventional method of increasing the output of LDPS apparatus is to increase the output power of the laser source. This increases the plasma temperature which, in turn, produces more output radiation. However, an increase in temperature means that the peak output wavelength of the black body radiation $\lambda_{max}$ shifts even further away from the desired wavelength band, and the additional radiation generated may not be useful.

Figure 6:
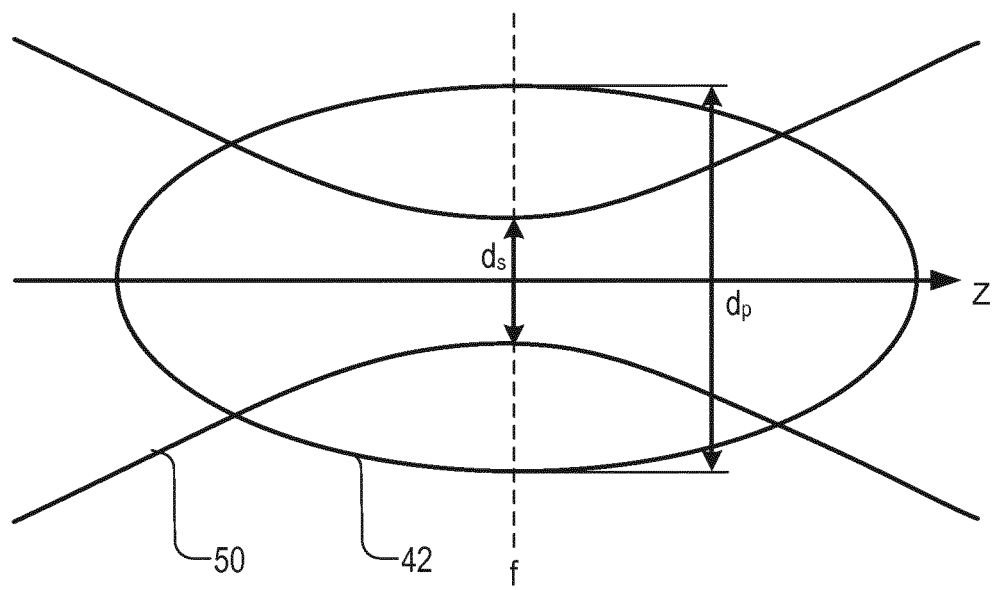
FIG. 6 shows a detail of the plasma generation location depicted in FIG. 5.

As already described, An LDPS apparatus works by focusing drive radiation 50 from a laser source 52 into a (already ignited) plasma 42. The plasma 42 is then pumped by the drive radiation 50 and emits broadband radiation. To sustain the plasma 42, the energy density of the drive radiation 50 should be sufficiently high. This energy density is typically obtained by focusing the drive radiation 50 into a narrow region in the center of the container 40. This is illustrated in FIG. 6, which is a detail of the region where plasma 42 is generated, depicted in FIG. 5. Shown is a beam of drive radiation 50 focused at the focal plane f on the Z axis. The focused beam diameter $d_s$ is the diameter of the beam of drive radiation 50 at the focal plane f of the drive optics 54, i.e., the beam diameter at its smallest point. Also shown is the resultant plasma 42 (here depicted in a more typical cigar shape) having a diameter $d_p$ at its widest point. The drive optics 54 are typically designed such that the beam diameter $d_s$ at the focal plane of drive optics 54 is as small as possible, therefore maximising the energy density of the drive radiation 50 at the focal plane f.

It is proposed to alter the point spread function of the drive optics 54 such that the energy density of the drive radiation 50 at the plasma location is decreased. Decreasing the energy density may appear counter-intuitive as it results in a decrease in the plasma temperature, and consequently a decrease in the total radiation output. However, the inventors have identified that the decrease in plasma temperature also results in the black body radiation output shifting towards the longer wavelengths. This shift means that more radiation within the desired wavelength band is produced even though the total amount of radiation produced is less. Clearly the energy density of the drive radiation 50 must remain sufficiently high to be able to maintain the plasma 42. As a result of the reduction of energy density of the drive radiation 50 at the plasma location, the resultant plasma 42 will be larger in size (e.g., plasma diameter $d_p$ is increased).

The point spread function determines the spatial intensity distribution within the focused beam of the drive radiation 50, i.e., the spatial intensity distribution at the focal plane of the drive optics 54. The size of the point spread function determines the size of the focused beam diameter at the focal plane of the drive optics 54. It is proposed that the point spread function of the drive optics 54 is configured such that the focused beam diameter and/or the spatial intensity distribution within the focused beam is such that the spectral position of a peak output wavelength of the black body portion of output radiation emitted by said plasma is maintained within a desired wavelength band. Where the LDPS is to be used as a source for an inspection apparatus, the desired wavelength band may be the wavelength band usable by the inspection apparatus. Where this is not possible or is undesirable due to other considerations (for example spectral broadening of the emission lines as discussed later), the desired wavelength band may be wider or different to this usable wavelength band, but chosen such that maintenance of the peak output wavelength of the black body radiation within this desired band still acts to shift more of the total black body radiation output to within the usable wavelength band. By way of example, shifting the peak output wavelength of the black body radiation nearer to the usable wavelength band may increase the radiation output at usable wavelengths, even if the peak output wavelength of the black body radiation remains outside of this usable wavelength band.

The point spread function is a characteristic of the drive optics 54. The point spread function at the focal plane of drive optics 54 depends on the focal length of the drive optics 54 and on the quality of the optical components within drive optics 54. In dependence on the selection and configuration of drive optics 54, the focused beam diameter can be made to be wider or smaller, and/or the spatial intensity distribution within the focused beam diameter can be altered.

In one embodiment, it is proposed that the drive optics 54 be configured such that the focused beam diameter of the drive radiation 50 is greater than an achievable minimum, i.e., it is deliberately configured to be larger than the minimum size achievable. The focused beam diameter may be taken to be the diameter of the Airy disk within the focused beam diameter, and may be measured as a full width at half maximum (FWHM) diameter. An achievable minimum would be the minimum focused beam diameter achievable without the introduction of deliberate aberrations to the drive optics, and where the focal length is optimized to minimize the focused beam diameter for a given wavelength, or range of wavelengths, of the drive radiation 50.

In present systems, the focused beam diameter is in the region of 10 μm. It is proposed in this embodiment that the drive optics 54 be configured such that focused beam diameter is greater than 20 μm, greater than 50 μm, greater than 80 μm or greater than 100 μm. In a specific embodiment the focused beam diameter is of an order of magnitude of 100 μm. These laser focused beam diameters are given as their sizes in free space, that is in the absence of plasma, and are expressed as FWHM diameters.

The focused beam diameter depends on the focal distance and on the quality of the drive optics 54. For aberration free optical components and a beam of drive radiation having a Gaussian intensity distribution, the size (radius) $r_s$ of the focused beam for an optical system (e.g. drive optics 54) can be calculated by:

$$r_s = \frac{4\lambda}{\pi} \frac{f}{d}$$

where f is focal length of the optical system, d is the aperture diameter of the optical system, and λ is the radiation wavelength.

In an embodiment, it is proposed to select a focal length of the laser drive optics 54 in order to control the point spread function of the laser drive optics 54. More specifically, it is proposed to select a focal length of the laser drive optics 54 in order to increase the focused beam diameter so that it is greater than an achievable minimum, or such that it has a diameter greater than 20 μm, greater than 50 μm, greater than 80 μm or greater than 100 μm as mentioned above. As before, the focused beam diameters are provided for the focused beam diameter in free space (i.e. in the absence of plasma) and are expressed as FWHM diameters. Alternatively or in addition to increasing the focused beam diameter by selection of an appropriate focal length, it is also envisaged that this may be done by selection of an appropriate aperture diameter of the laser drive optics 54.

This method can be incorporated within an active control. This can be done, for example, by providing a controller operable to monitor said spectral position of the peak output wavelength of the black body portion of output radiation, and control the drive optics in dependence thereon so as to maintain said spectral position of said peak output wavelength of the black body portion of output radiation within a desired wavelength band.

FIG. 5 shows a controller 64 which receives a feedback signal 65 which conveys spectral information on the radiation emitted by the plasma. Controller 64 outputs a control signal 66 which controls the drive optics 54. Control of the drive optics 54 may comprise control of the focal length and/or the aperture diameter so as to maintain the spectral position of the peak output wavelength of the black body radiation at a desired wavelength or within a desired wavelength band. The drive optics 54 may have a zoom functionality to provide the necessary control of the focal length. While the feedback signal 65 is shown here as originating from the collection optics 44, it could originate from a monitoring device located elsewhere.

In another, static, embodiment, one or more optical components within the drive optics 54 may be designed and configured so as to alter the point spread function of the drive optics 54. The altering of the point spread function may result in a more distributed spatial intensity distribution profile of the focused drive radiation 50 (within the Airy disk), which in turn results in a reduced energy density at the focal plane of the drive optics 54. Alternatively or in addition, the altering of the point spread function may result in an increased focused beam diameter of the drive radiation 50. In either case, this may be achieved by designing the one or more of the optical components with deliberate optical aberrations. This is in contrast to conventional microscopy or imaging optics, where the goal is to minimize aberration as much as possible.

Figure 7:
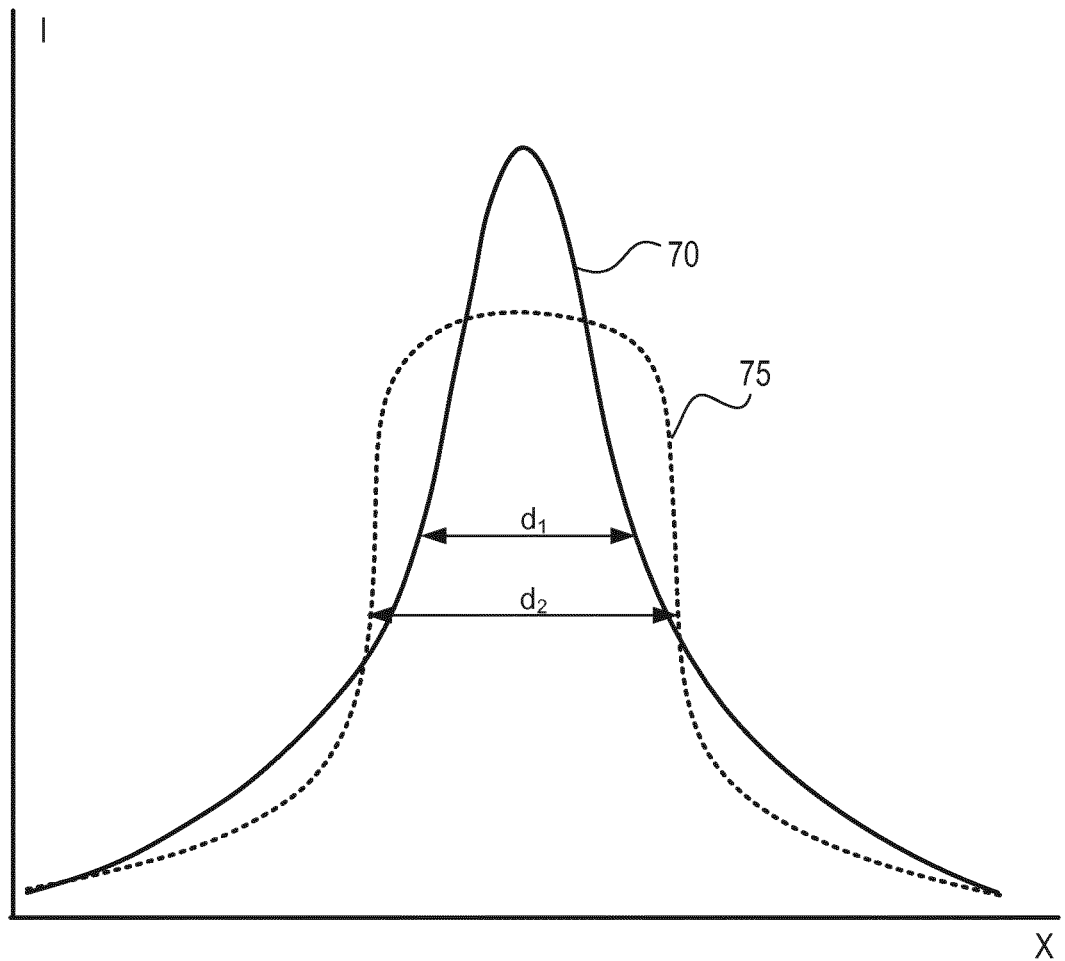
FIG. 7 is a graph showing a Gaussian spatial intensity profile and a spatial intensity profile flattened in accordance with an embodiment of the invention.

FIG. 7 is a plot of intensity I against distance X, and shows a typical spatial intensity distribution profile 70 of radiation focused by an optical system having no aberration, and more specifically the intensity distribution profile of the Airy disk. As can be observed, the spatial intensity distribution profile 70 is approximately Gaussian. Labelled is the focused beam diameter $d_1$ for this plot (FWHM measurement). FIG. 7 also shows a spatial intensity distribution profile 75 for an optical system comprising a deliberate aberration which acts to flatten the spatial intensity distribution profile 75, thereby converting the Gaussian spatial intensity profile of the drive radiation 50 into a more uniform distribution. Labelled is the focused beam diameter $d_2$ for this plot (FWHM measurement). Drive optics 54 may comprise the optical system which produces intensity distribution profile 75. As can be seen, in this example, flattening the spatial intensity distribution profile causes the intensity distribution profile 75 peak to be lower and wider than the Gaussian distribution, resulting in a substantially flat-top profile. Flattening the spatial intensity distribution in this way reduces the energy density of the drive radiation 50 at the focal plane of the drive optics 54, thereby reducing the resultant plasma temperature. In addition, focused beam diameter $d_2$ is larger than focused beam diameter $d_1$. The aberrations may result in the focused beam diameter $d_2$ for drive radiation 50, focused using an optical system having deliberate aberrations, to be (for example) 10% greater, 20% greater, 30% greater or 40% greater than the focused beam diameter $d_1$ for the same optical system without deliberate aberrations. The aberrations may result in the intensity distribution profile 75 peak for the drive radiation focused using an optical system having deliberate aberrations to be (for example) 10% lower, 20% lower or 30% lower than the intensity distribution profile 70 peak for the same optical system without deliberate aberrations.

It should be noted that the configuring of the spatial intensity distribution profile can take into account the spatial intensity distribution profile along the optical axis as this will also affect the shape of the plasma. Consequently aberrations may be modelled into the drive optics 54 which flatten, or otherwise alter, the point spread function, and therefore spatial intensity distribution profile, in three dimensions.

The deliberately introduced aberrations may be any kind of aberrations, for example spherical aberrations or astigmatism.

In an embodiment, in a first step, a desired point spread function or intensity distribution (in either 2D or 3D) is determined. Following this, the drive optics 54 (and optical components within) are optimized accordingly so as to have the desired point spread function. These steps can be modelled using software, where a user may input boundary conditions, for example: minimum and/or maximum focused beam diameter and focal length. The modelled variables may include any variables due to aberration, the focal length and/or the aperture diameter.

It should be appreciated that the embodiments where aberrations are deliberately introduced to the drive optics 54 in order to configure the point spread spectrum can be combined with embodiments where the point spread spectrum is configured by changing the focal length (or entrance diameter) of the drive optics 54. In this way, the drive optics 54 may comprise aberrations to flatten the point spread spectrum, while still providing an active control of focal length (or entrance diameter), and therefore of the focused beam diameter, via the feedback loop 64, 65, 66 as described above.

By way of example, it is proposed that the resultant energy density of the focused drive radiation when using the methods described herein may be between 20 W and 500 W over a focused beam diameter of between 2 μm to 200 μm. A specific example has an energy density of 100 W over a 6 μm focused beam diameter, which results in an energy density of $3.5 \times 10^{12}$ W/m$^2$. The energy density may have an order of magnitude between $10^7$ W/m$^2$ and $10^{14}$ W/m$^2$, between $10^{11}$ W/m$^2$ and $10^{13}$ W/m$^2$, or more specifically may have an order of magnitude of $10^{12}$ W/m$^2$.

It should also be noted that larger volume, and lower brightness (where brightness is defined as energy density of the emitting radiation), of the plasma can be useful in an optical system that is limited by the etendue (geometrical extent) of the source, as the emitting volume is increased.

Of course, should light of lower wavelengths be preferred, the point spread function of the drive optics 54 may be configured (for example made smaller) such that the energy density at the plasma location is increased. This results in an increase in the radiation intensity at higher (e.g. UV) wavelengths.

When performing the methods disclosed, it is important to realise that the spectral width of the atomic emission lines of the plasma are also temperature dependent, and that changing of the plasma temperature to shift the peak wavelength of the black body radiation may result in broadening of these spectral lines. Pure thermal broadening (Doppler effect) is essentially negligible (sub-nanometers), while pressure induced broadening (Stark effect) is linear in pressure within plasma which on its turn depends on total drive radiation energy and plasma size. This broadening can be in the order of multiple nanometers (up to tens of nanometers) for the conditions described herein.

The spectral line broadening is dependent upon the concentration of the ionized particles in the plasma, which is directly related to plasma pressure. This means that the spectral line broadening cannot be tuned completely independently of both temperature and pressure. When plasma size changes, the pressure within plasma also changes and spectral line broadening is affected. Where no special care is taken with regard to spectral line broadening, the spectral line broadening will be a side-effect of temperature change and resultant pressure change. More specifically, the pressure increases with increase in temperature, resulting in spectral line broadening. This can be positive where a smooth spectrum is desired. When high intensity in the spectral peaks of atomic lines is desired, it is preferable to maintain pressure (and therefore temperature) low.

Consequently, in an embodiment, it is proposed to account for the spectral line broadening when performing the methods disclosed herein to ensure that the total usable plasma radiation output attributable to the spectral lines is not adversely affected by spectral broadening. In an embodiment, any candidate point spread function or intensity profile being considered as suitable for reducing the plasma temperature and shifting the black body radiation peak, when designing the drive optics 54, should also be assessed for its impact on spectral line broadening. Following this assessment, should the impact on spectral line broadening be unacceptable, for example should the degree of spectral line of broadening be outside predefined limits, then the candidate point spread function should be amended or rejected.

Using the concepts disclosed herein, the output spectrum of the LDPS can be tuned to a certain degree and the efficiency of the source can be optimized for its specific application. Increasing the efficiency decreases the cooling needs of the module and decreases the costs. Furthermore by decreasing the maximum temperature of the plasma, less UV radiation is produced, and therefore less solarization takes place. The reduction in solarization and the smaller heat load on the container will result in a longer lifetime of the container glass.

Further embodiments according to the invention are provided in below numbered clauses:

1. A laser-driven photon source comprising drive optics operable to focus drive radiation so as to maintain a plasma; wherein said drive optics has a point spread function which is configured such that a spectral position of a peak output wavelength of a black body portion of output radiation emitted by said plasma is within a desired wavelength band.
2. A laser-driven photon source according to clause 1 wherein the point spread function is such that a focused beam diameter of the drive radiation at the focal plane of said drive optics, after having been focused by said drive optics, is greater than 20 μm, said beam diameter expressed as full width at half maximum.
3. A laser-driven photon source according to clause 1 wherein the point spread function is such that a focused beam diameter of the drive radiation at the focal plane of said drive optics, after having been focused by said drive optics, is greater than 50 μm, said beam diameter expressed as full width at half maximum.
4. A laser-driven photon source according to clause 1 wherein the point spread function is such that a focused beam diameter of the drive radiation at the focal plane of said drive optics, after having been focused by said drive optics, is of an order of magnitude of 100 μm, said beam diameter expressed as full width at half maximum.
5. A laser-driven photon source according to any preceding clause wherein said drive optics are adjustable so as to change said point spread function.
6. A laser-driven photon source according to clause 5 wherein said laser-driven photon source comprises a controller operable to monitor said spectral position of the peak output wavelength of the black body portion of output radiation, and control the drive optics in dependence thereon so as to maintain said spectral position of said peak output wavelength of the black body portion of output radiation within the desired wavelength band.

7. A laser-driven photon source according to any preceding clause wherein a focal length of said drive optics is adjustable so as to enable adjustment of a size of said point spread function.
8. A laser-driven photon source according to any preceding clause wherein a size of an entrance aperture of said drive optics is adjustable so as to enable adjustment of a size of said point spread function.
9. A laser-driven photon source according to any preceding clause wherein said drive optics comprise at least one predetermined deliberate aberration to achieve said configuration of the point spread function.
10. A laser-driven photon source according to clause 9 wherein said predetermined deliberate aberration flattens the point spread function, such that intensity within a beam of the drive radiation at the focal plane, having been focused by said drive optics, is distributed spatially more evenly.
11. A laser-driven photon source according to clause 10 wherein said predetermined deliberate aberration results in a flat-top profile of said point spread function.
12. A laser-driven photon source according to any of clauses 9 to 11 wherein said predetermined deliberate aberration increases the size of said point spread function.
13. A laser-driven photon source according to any preceding clause comprising a laser source operable to emit said drive radiation.
14. A laser-driven photon source according to any preceding clause operable such that the energy density of the drive radiation at a location where said plasma is maintained has an order of magnitude between $10^7$ W/m$^2$ and $10^{14}$ W/m2.
15. A laser-driven photon source according to any of clauses 1 to 13 operable such that the energy density of the drive radiation at a location where said plasma is maintained has an order of magnitude between $10^{11}$ W/m$^2$ and $10^{13}$ W/m$^2$.
16. A laser-driven photon source according to any preceding clause wherein the point spread function of said drive optics is configured to maintain a spectral position of a peak output wavelength of total output radiation emitted by said plasma within a desired wavelength band, said total output radiation comprising said black body portion of the output radiation and emission lines of the plasma.
17. An inspection apparatus comprising a laser-driven photon source according to any preceding clause, operable such that output radiation emitted by said plasma is used as inspection radiation when performing an inspection operation.
18. An inspection apparatus according to clause 17 comprising a radiation filter which passes only said output radiation which comprises wavelengths within a usable wavelength band, and said desired wavelength band is such that maintenance of the peak output wavelength of the black body radiation within this desired band acts to shift more of the total black body radiation output to within the usable wavelength band.
19. An inspection apparatus according to clause 18 wherein said desired wavelength band is said usable wavelength band.
20. An inspection apparatus according to clause 18 or 19 wherein said desired wavelength band and/or said usable wavelength band is adjustable according to requirements of a particular inspection operation.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A laser-driven photon source comprising:
   drive optics configured to focus drive radiation so as to maintain a plasma,
   wherein:
   the drive optics adjusts a point spread function by adjusting one of:
   a focal length of the drive optics so as to adjust the point spread function, or
   a size of an entrance aperture of the drive optics to adjust the point spread function, and
   wherein the point spread function is configured such that a spatial intensity distribution profile of the drive radiation is a non-Gaussian distribution to reduce an energy density of the drive radiation at a focal plane of the drive optics, thereby controlling a spectral position of a peak output wavelength of a black body portion of output radiation emitted by said plasma within a desired wavelength band.

2. The laser-driven photon source of claim 1, wherein the point spread function is configured such that a focused beam diameter of the drive radiation at a focal plane of said drive optics, after having been focused by said drive optics, is greater than 20 µm, said beam diameter expressed as full width at half maximum.

3. The laser-driven photon source of claim 1, wherein the point spread function is configured such that a focused beam diameter of the drive radiation at a focal plane of said drive optics, after having been focused by said drive optics, is greater than 50 µm, said beam diameter expressed as full width at half maximum.

4. The laser-driven photon source of 1, wherein the point spread function is configured such that a focused beam diameter of the drive radiation at a focal plane of said drive optics, after having been focused by said drive optics, is greater than 100 µm, said beam diameter expressed as full width at half maximum.

5. The laser-driven photon source of claim 1, further comprising a controller configured to monitor said spectral position of the peak output wavelength of the black body portion of output radiation, and control the drive optics in dependence thereon so as to maintain said spectral position of said peak output wavelength of the black body portion of output radiation within the desired wavelength band.

6. The laser-driven photon source of claim 1, further comprising a laser source to emit said drive radiation.

7. The laser-driven photon source of claim 1, wherein the energy density of the drive radiation at a location where said plasma is maintained has an order of magnitude between $10^{11}$ W/m$^2$ and $10^{13}$ W/m$^2$.

8. The laser-driven photon source of claim 1, wherein the point spread function of said drive optics is configured to maintain a spectral position of a peak output wavelength of total output radiation emitted by said plasma within a desired wavelength band, said total output radiation comprising said black body portion of the output radiation and emission lines of the plasma.

9. An inspection method comprising:
focusing drive radiation using the laser-driven photon source of claim 1; and
using the output radiation emitted by the plasma as inspection radiation to perform an inspection operation.

10. The inspection method of claim 9, further comprising filtering said output radiation to pass only the wavelengths above 400 nm.

11. The laser-driven photon source of claim 1, wherein the point spread function is configured such that a focused beam diameter of the drive radiation at a focal plane of said drive optics, after having been focused by said drive optics, is greater than 80 µm, said beam diameter expressed as full width at half maximum.

12. The laser-driven photon source of claim 1, wherein the spectral position of the peak output wavelength of a black body portion of output radiation emitted by said plasma is between 400 nm and 900 nm.

13. The laser-driven photon source of claim 1, wherein a peak of the intensity distribution profile is lower and wider than a Gaussian distribution.

14. The laser-driven photon source of claim 1, wherein the spatial intensity distribution profile is a substantially flat-top profile.

* * * * *